United States Patent
Lee et al.

(10) Patent No.: US 12,444,830 B2
(45) Date of Patent: Oct. 14, 2025

(54) ELECTRONIC DEVICE INCLUDING ANTENNA

(71) Applicant: SAMSUNG ELECTRONICS CO., LTD., Suwon-si (KR)

(72) Inventors: Woosup Lee, Suwon-si (KR); Jungsik Park, Suwon-si (KR); Jungoh Sung, Suwon-si (KR); Muyeol Lee, Suwon-si (KR); Sehwan Choi, Suwon-si (KR); Sukgi Hong, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 18/080,177

(22) Filed: Dec. 13, 2022

(65) Prior Publication Data

US 2023/0110427 A1    Apr. 13, 2023

Related U.S. Application Data

(63) Continuation of application No. PCT/KR2021/004700, filed on Apr. 14, 2021.

(30) Foreign Application Priority Data

Jun. 18, 2020    (KR) .......................... 10-2020-0074519

(51) Int. Cl.
*H01Q 1/24* (2006.01)
*H01Q 1/02* (2006.01)
(Continued)

(52) U.S. Cl.
CPC ............... *H01Q 1/243* (2013.01); *H01Q 1/02* (2013.01); *H01Q 1/526* (2013.01); *H01Q 7/06* (2013.01);
(Continued)

(58) Field of Classification Search
CPC .. H05K 1/02; H05K 1/14; H05K 7/20; H05K 2201/066
See application file for complete search history.

(56) References Cited

U.S. PATENT DOCUMENTS

| | | | |
|---|---|---|---|
| 11,910,516 B2* | 2/2024 | Moon | H05K 1/14 |
| 2015/0241935 A1* | 8/2015 | Jang | G06F 1/1626 |
| | | | 361/679.56 |

(Continued)

FOREIGN PATENT DOCUMENTS

KR    10-2016-0115511 A    10/2016

OTHER PUBLICATIONS

Korean Notice of Decision to Grant dated Sep. 11, 2024 for KR Application No. 10-2020-0074519.

*Primary Examiner* — Dimary S Lopez Cruz
*Assistant Examiner* — Austin M Back
(74) *Attorney, Agent, or Firm* — Nixon & Vanderhye P.C.

(57) ABSTRACT

An electronic device including an antenna according to various embodiments comprises: a printed circuit board disposed in a first area of the electronic device; a battery disposed in a second area of the electronic device; a heat dissipation member including a thermally conductive material disposed on the upper part of the printed circuit board and the battery; a first antenna disposed in the first area on the heat dissipation member; and a second antenna disposed in the second area on the heat dissipation member, wherein the frequency bands and the dielectric constants of the first antenna and the second antenna may be configured differently.

13 Claims, 15 Drawing Sheets

(51) Int. Cl.
  *H01Q 1/52*   (2006.01)
  *H01Q 7/06*   (2006.01)
  *H01Q 9/04*   (2006.01)
  *H01Q 25/00*  (2006.01)
  *H05K 7/20*   (2006.01)
  *H05K 9/00*   (2006.01)

(52) U.S. Cl.
  CPC ......... *H01Q 9/0407* (2013.01); *H01Q 25/002* (2013.01); *H05K 7/20472* (2013.01); *H05K 9/0024* (2013.01)

(56) References Cited

U.S. PATENT DOCUMENTS

| | | | |
|---|---|---|---|
| 2016/0285151 A1 | 9/2016 | Lee et al. | |
| 2018/0359877 A1* | 12/2018 | Wang | H02J 7/0045 |
| 2019/0386388 A1* | 12/2019 | Yamamoto | H02J 50/12 |
| 2020/0251811 A1* | 8/2020 | Elghannai | H05K 1/165 |
| 2020/0403297 A1* | 12/2020 | Park | H01Q 1/38 |
| 2022/0173494 A1* | 6/2022 | Bolotov | H05K 9/00 |

\* cited by examiner

ELECTRONIC DEVICE INCLUDING ANTENNA

CROSS-REFERENCE TO RELATED APPLICATIONS

This application is a continuation of International Application No. PCT/KR2021/004700 designating the United States, filed on Apr. 14, 2021, in the Korean Intellectual Property Receiving Office and claiming priority to Korean Patent Application No. 10-2020-0074519, filed on Jun. 18, 2020, in the Korean Intellectual Property Office, the disclosures of which are incorporated by reference herein in their entireties.

BACKGROUND

Field

The disclosure relates to an electronic device including a plurality of antennas.

Description of Related Art

The use of portable electronic devices such as a smart phone and a tablet PC is increasing.

The electronic device may transmit power to another electronic device or transmit and receive various data with another electronic device.

For example, the electronic device may transmit power using wireless power consortium (WPC) and alliance of wireless power (A4WP), which are international standards. Also, the electronic device may transmit and receive data through global positioning system (GPS), Wi-Fi, long-term evolution (LTE), ultra-wide band (UWB), near field communication (NFC), Bluetooth, and/or magnetic stripe transmission (MST) communication.

In order to perform wireless communication with another electronic device, the electronic device may include at least one antenna.

The electronic device may include a plurality of components (e.g., a processor, a memory, a battery, a camera device, a speaker module, and a sensor module) in order to implement various functions.

As a plurality of components are included in the electronic device, a space for mounting antennas having different frequency bands may be limited.

The electronic device needs to have antennas having different characteristics in order to provide various services.

SUMMARY

Embodiments of the disclosure provide an electronic device including a plurality of antennas having different frequency bands and different dielectric constants.

An electronic device according to various example embodiments of the disclosure may include: a printed circuit board disposed in a first area of the electronic device; a battery disposed in a second area of the electronic device; a heat dissipation member including a thermally conductive material disposed on the printed circuit board and the battery; a first antenna disposed in the first area on the heat dissipation member; and a second antenna disposed in the second area on the heat dissipation member, wherein frequency bands of the first antenna and the second antenna may be different.

An electronic device according to various example embodiments of the disclosure may include: a printed circuit board disposed in a first area of the electronic device; a battery disposed in a second area of the electronic device; a heat dissipation member comprising a thermally conductive material disposed on the printed circuit board and the battery; a first antenna disposed in the first area on the heat dissipation member and including a dielectric and a first layer disposed on the dielectric; and a second antenna disposed in the second area on the heat dissipation member and including a base layer, a first conductive layer disposed on the base layer, and a second conductive layer disposed under the base layer, wherein the second conductive layer extends under the dielectric of the first antenna and is configured to perform a grounding function of the first antenna.

An electronic device according to various example embodiments of the disclosure may include: a printed circuit board disposed in a first area of the electronic device; a battery disposed in a second area of the electronic device; a heat dissipation member comprising a thermally conductive material disposed on the printed circuit board and the battery; a first antenna disposed in the first area on the heat dissipation member and including a dielectric and a second layer disposed under the dielectric; and a second antenna disposed in the second area on the heat dissipation member and including a base layer, a first conductive layer disposed on the base layer, and a second conductive layer disposed under the base layer, wherein the base layer and the first conductive layer may be disposed to extend over the dielectric of the first antenna, and the first conductive layer may be configured to perform a patch function of the first antenna.

According to various example embodiments of the disclosure, by arranging the first antenna (e.g., a patch antenna FPCB) and the second antenna (e.g., a coil antenna FPCB) having different frequency bands and dielectric constants in the first area and the second area which are coplanar on the heat dissipation member, it is possible to efficiently use the limited space in the electronic device.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Figure 1:
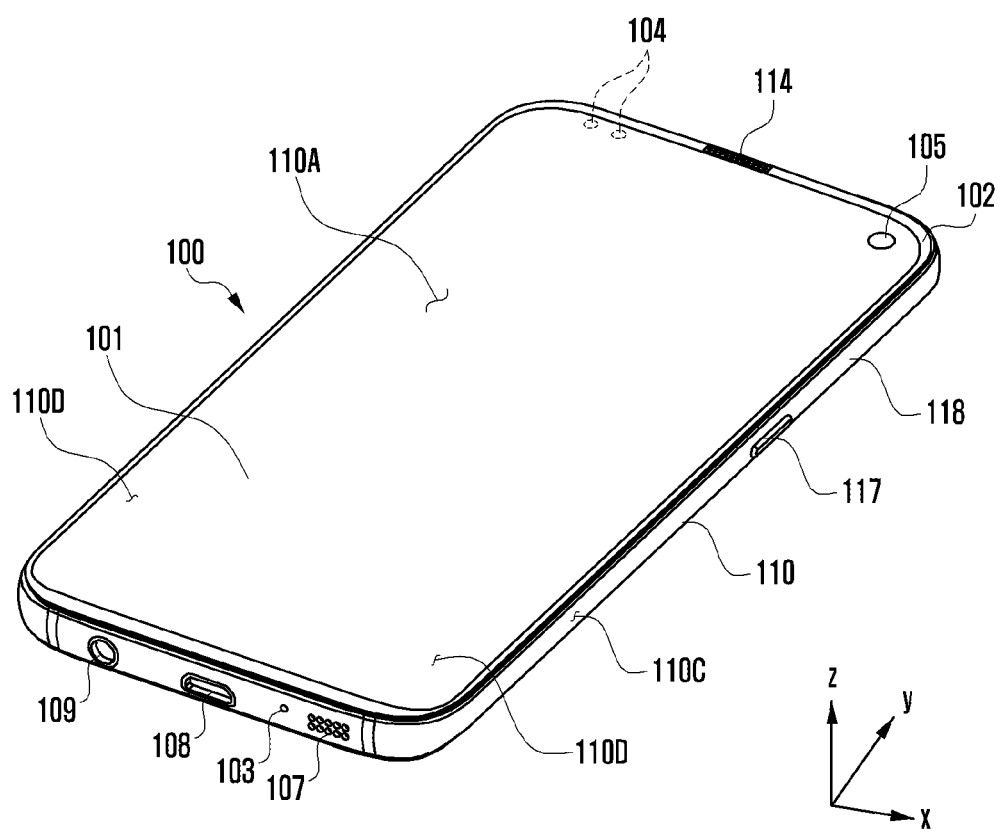
FIG. 1 is a front perspective view of a mobile electronic device according to various embodiments.

FIG. 1 is a front perspective view illustrating a mobile electronic device according to various embodiments.

Figure 2:
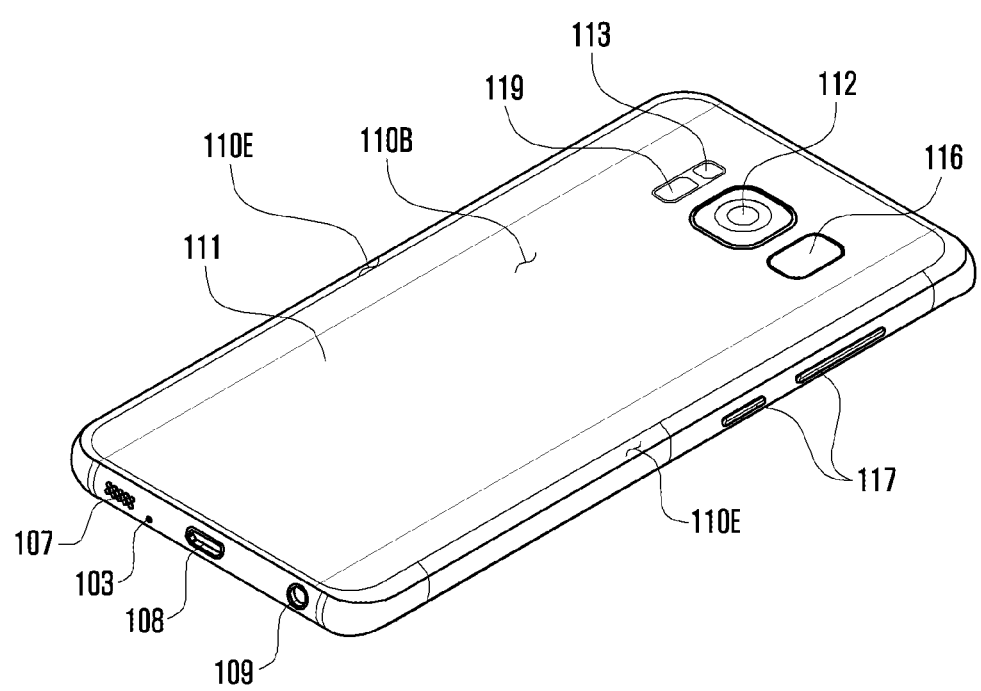
FIG. 2 is a rear perspective view of the electronic device of FIG. 1 according to various embodiments.

FIG. 2 is a rear perspective view illustrating the electronic device of FIG. 1 according to various embodiments.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In an embodiment (not illustrated), the housing may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In various embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In various embodiments, the front plate 102 (or the rear plate 111) may include only one of the first areas 110D (or the second areas 110E). In an embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In various embodiments, at least one of the elements (for example, the key input device 117 or the light-emitting element 106) of the electronic device 100 may be omitted, or the electronic device 100 may additionally include another element.

The display 101 may be visible through a corresponding part of the front plate 102, for example. In various embodiments, at least a part of the display 101 may be visible through the front plate 102 that forms the first areas 110D of the side surface 110C and the first surface 110A. In various embodiments, the display 101 may have a corner formed in substantially the same shape as that of the adjacent outer periphery of the front plate 102. In an embodiment (not illustrated), in order to increase the area of exposure of the display 101, the interval between the outer periphery of the display 101 and the outer periphery of the front plate 102 may be formed to be substantially identical.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in various embodiments. The speaker holes 107 and 114 may include an outer speaker hole 107 and a speech receiver hole 114. In various embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, an HRM sensor) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In various embodiments, two or more lenses (an infrared camera, a wide-angle lens, and a telephoto lens) and image sensors may be arranged on a single surface of the electronic device 100.

The key input device 117 may be arranged on the side surface 110C of the housing 110. In an embodiment, the electronic device 100 may not include a part of the above-mentioned key input device 117 or the entire key input device 117, and the key input device 117 (not included) may be implemented in another type, such as a soft key, on the display 101. In various embodiments, the key input device may include a sensor module 116 arranged on the second surface 110B of the housing 110.

The indicator may be arranged on the first surface 110A of the housing 110, for example. The indicator may provide information regarding the condition of the electronic device 100 in a light type, for example.

In an embodiment, the indication may provide a light source that interworks with operation of the camera module 105, for example. The light-emitting element 206 may include, for example, an LED, an IR LED, and a xenon lamp.

The connector holes 108 and 109 may include a first connector hole 108 capable of containing a connector (for example, a USB connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
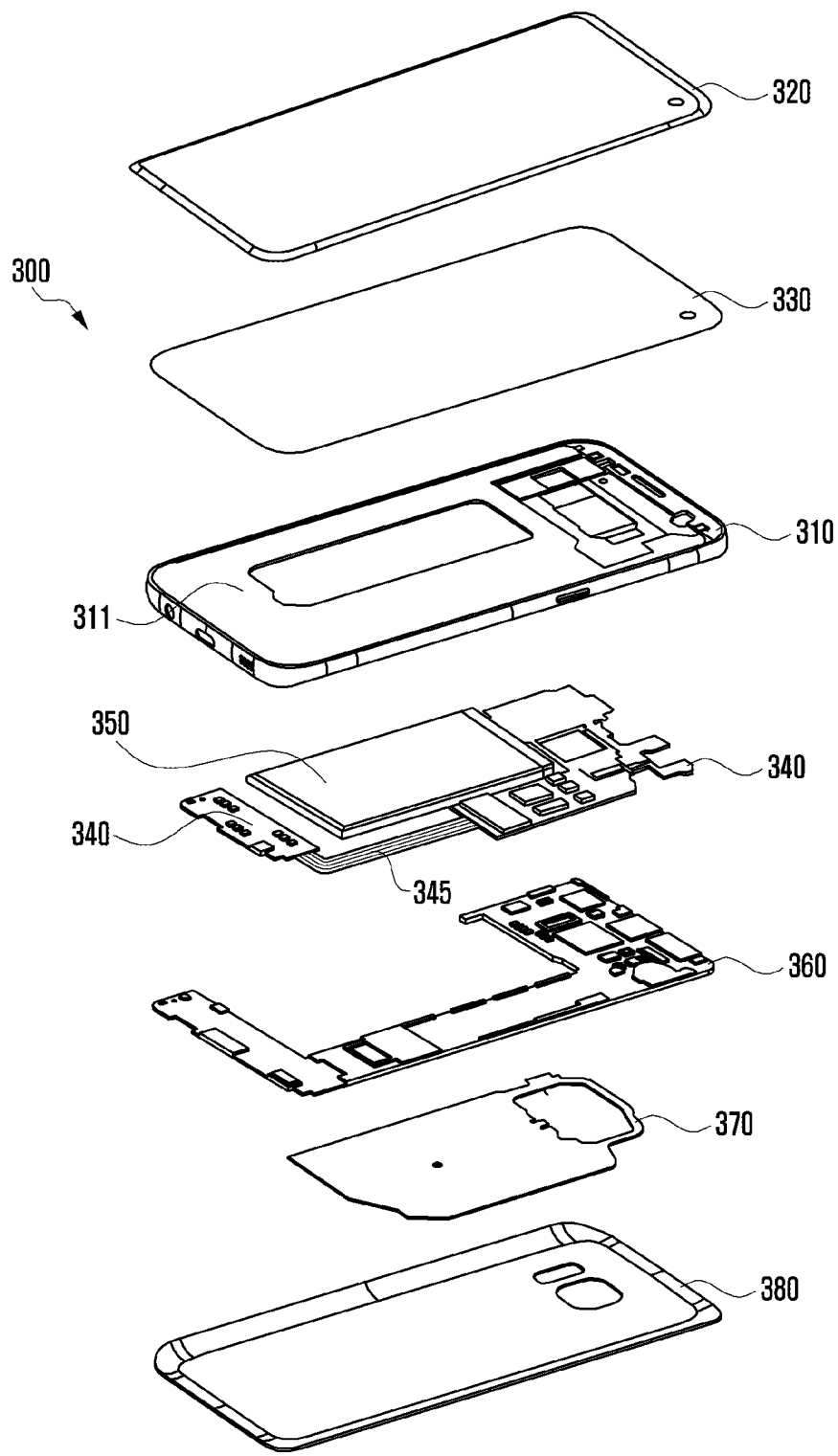
FIG. 3 is an exploded perspective view illustrating the electronic device of FIG. 1 according to various embodiments.

FIG. 3 is an exploded perspective view illustrating the electronic device of FIG. 1 according to various embodiments.

The electronic device 300 of FIG. 3 may include at least partially similar to the electronic device 100 of FIG. 1 and FIG. 2 or may include an embodiment of the electronic.

Referring to FIG. 3, the electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In various embodiments, at least one of the elements (for example, the first support member 311 or the second support member 360) of the electronic device 300 may be omitted, or the electronic device 300 may further include another element. At least one of the elements of the electronic device 300 may be identical or similar to at least one of the elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof.

A processor, a memory, and/or an interface may be mounted on the printed circuit board 340. The processor may include, for example, one or more of a central processing device, an application processor, a graphic processing device, an image signal processor, a sensor hub processor, or a communication processor.

According to various embodiments, the printed circuit board 340 may be formed at least in part in a first direction (e.g., an upper side) and/or in a second direction (e.g., a lower side) of the electronic device 300. The printed circuit board 340 may have a structure in which a plurality of printed circuit boards (PCBs) are stacked. The printed circuit board 340 may include an interposer structure. The printed circuit board 340 provided in the first direction (e.g., the upper side) and the second direction (e.g., the lower side) may be electrically connected through an FPCB 345.

The memory may include a volatile memory or a non-volatile memory, for example.

The interface may include, for example, a high definition multimedia interface (HDMI), a universal serial bus (USB) interface, an SD card interface, and/or an audio interface. The interface may connect the electronic device 300 with an external electronic device electrically or physically, for example, and may include a USB connector, an SD card/MMC connector, or an audio connector.

The battery 350 is a device for supplying power to at least one element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna.

The antenna 370 may conduct near-field communication with an external device or may wirelessly transmit/receive power necessary for charging, for example. In an embodiment, an antenna structure may be formed by a part or a combination of the side bezel structure 310 and/or the first support member 311.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Figure 4:
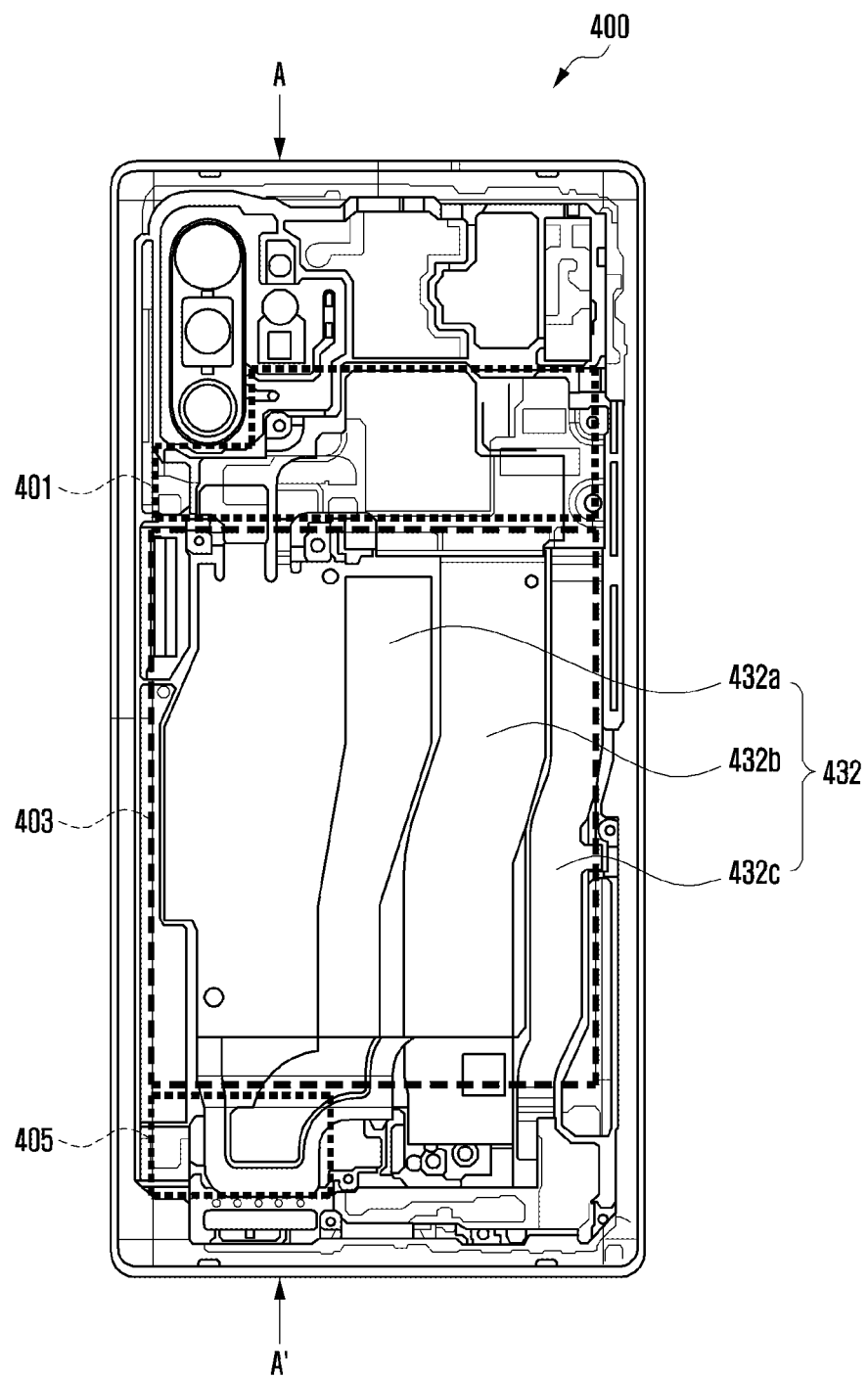
FIG. 4 is a diagram illustrating an example internal configuration of an electronic device including an antenna according to various embodiments.
Figure 5:
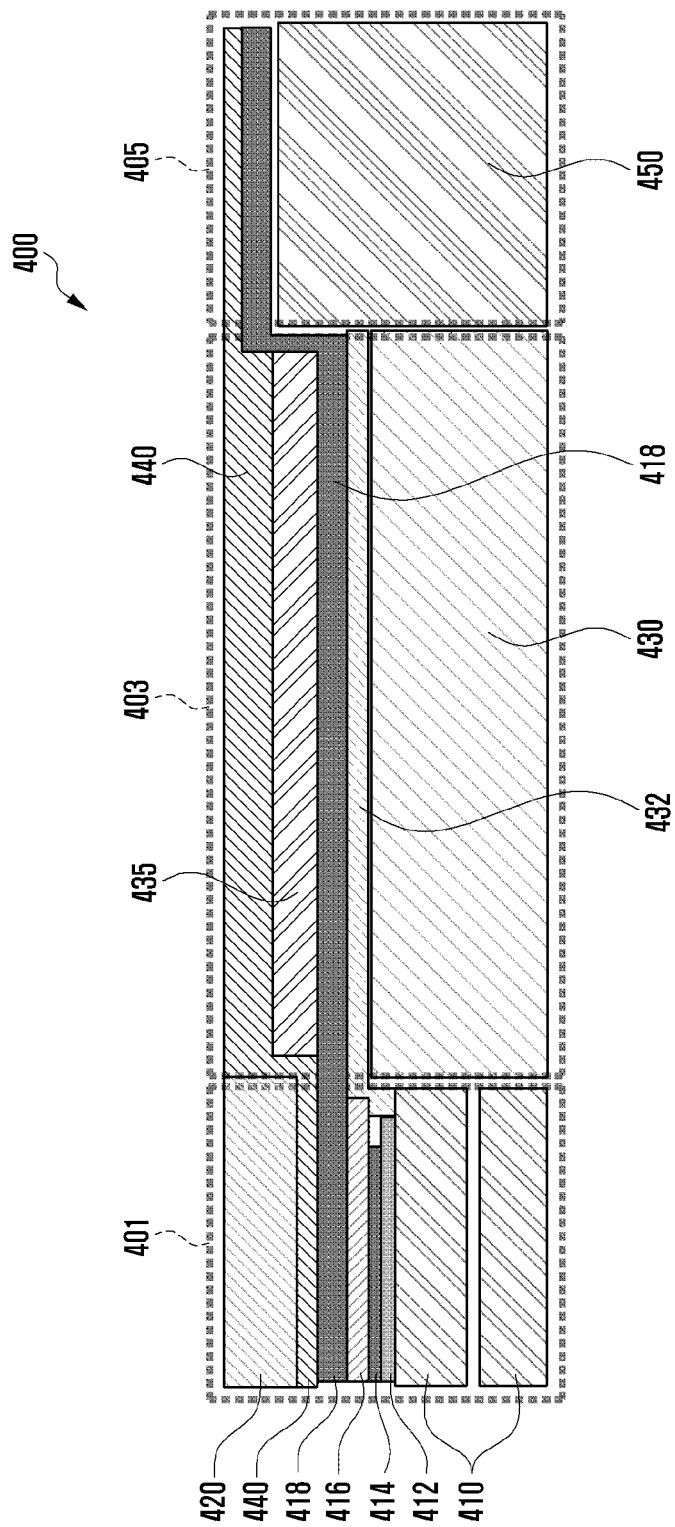
FIG. 5 is a cross-sectional view taken along line A-A' of FIG. 4 according to various embodiments.

FIG. 4 is a diagram illustrating an example internal configuration of an electronic device including an antenna according to various embodiments. FIG. 5 is a cross-sectional view taken along line A-A' of FIG. 4 according to various embodiments.

According to various embodiments, the electronic device 400 of FIG. 4 may include the electronic devices 100 and 300 illustrated in FIGS. 1, 2 and 3. FIG. 4 may be a transparent perspective view of the electronic device 400 viewed from its rear surface.

With reference to FIGS. 4 and 5, the electronic device 400 according to various embodiments of the disclosure may have a first area 401, a second area 403, and a third area 405.

According to an embodiment, the first area 401 may be partitioned in a first direction (e.g., left or upper side) of the electronic device 400. The second area 403 may be partitioned near the center of the electronic device 400. The third area 405 may be partitioned in a second direction (e.g., right or lower side) of the electronic device 400.

According to various embodiments, the first area 401, the second area 403, and the third area 405 are virtual areas partitioned for convenience of description, and the scope of the partition may not be limited.

With reference to FIG. 5, the first area 401 of the electronic device 400 according to various embodiments of the disclosure may include a printed circuit board 410, a shield can 412, a heat dissipation sheet 414, a support member 416, a heat dissipation member 418, and a first antenna 420.

According to an embodiment, on the printed circuit board 410, electronic components such as an application processor (AP), a communication processor (CP), a memory, and/or an interface may be mounted.

According to various embodiments, the printed circuit board 410 may include the printed circuit board 340 illustrated in FIG. 3. The printed circuit board 410 may include a structure in which a plurality of printed circuit boards (PCBs) are stacked. The printed circuit board 410 may include an interposer structure. At least a portion of the printed circuit board 410 may ground the first antenna 420.

According to various embodiments, the printed circuit board 410 may have a reduced thickness in the first area 401 in order to mount the first antenna 420.

According to various embodiments, in order to mount the first antenna 420 in the first area 401 of the electronic device 400, the printed circuit board 410, the shield can 412, the heat dissipation sheet 414, the support member 416, and the heat dissipation member 418 may have a reduced gap therebetween.

According to an embodiment, the shield can 412 may be disposed on the printed circuit board 410. The shield can 412 may be attached to an upper surface of the printed circuit board 410 through soldering or bonding. The shield can 412 may shield electromagnetic waves generated from electronic components (e.g., an application processor and a communication processor) mounted on the printed circuit board 410 or from the first antenna 420.

According to various embodiments, the shield can 412 may be made of a metal material having high thermal conductivity, such as copper or aluminum.

According to an embodiment, the heat dissipation sheet 414 may be disposed on the shield can 412. The heat dissipation sheet 414 may be combined with the shield can 412 or disposed to be spaced apart from the shield can 412 by a predetermined distance. The heat dissipation sheet 414 may dissipate heat generated from electronic components (e.g., an application processor and a communication processor) mounted on the printed circuit board 410.

According to various embodiments, the heat dissipation sheet 414 may absorb heat generated from the above electronic components or transfer it to the support member 416 for cooling. The heat dissipation sheet 414 may include at least one of a graphite sheet, a heat pipe, or a vapor chamber.

According to an embodiment, the support member 416 may be disposed on the heat dissipation sheet 414. The support member 416 may be attached to an upper surface of the heat dissipation sheet 414 through an adhesive sheet or bonding. The support member 416 may support the heat dissipation member 418, at least a portion of the second antenna 440, and the first antenna 420, which are disposed thereon.

According to various embodiments, the support member 416 may include the second support member 360 illustrated in FIG. 3. The support member 416 may include a metal SUS.

According to an embodiment, the heat dissipation member 418 may be disposed on the support member 416. The heat dissipation member 418 may be attached to an upper surface of the support member 416 through an adhesive sheet or bonding. The heat dissipation member 418 may dissipate heat generated from electronic components mounted on the printed circuit board 410.

According to various embodiments, the heat dissipation member 418 may extend to the second area 403 and the third area 405. The heat dissipation member 418 may include a graphite material. The heat dissipation member 418 may be formed of at least one layer.

According to an embodiment, at least a portion of the second antenna 440 provided in the second area 403 may be disposed above the heat dissipation member 418 provided in the first area 401.

According to an embodiment, the first antenna 420 may be disposed on an upper portion of the heat dissipation member 418 or on at least a portion of the second antenna 440.

According to various embodiments, the first antenna 420 and the second antenna 440 may be disposed on the heat dissipation member 418. The first antenna 420 and the second antenna 440 may be formed of a flexible printed circuit board (FPCB).

According to various embodiments, the first antenna 420 may include at least one patch antenna. The second antenna 440 may include at least one coil antenna. The first antenna 420 may cover a high frequency band of the GHz band (e.g., about 1 GHz to 100 GHz). The second antenna 440 may cover a low frequency band of the MHz band (e.g., about 10 MHz to 100 MHz).

According to various embodiments, the first antenna 420 may be used as an antenna of RF resonance type (e.g., ultra-wide band (UWB), Wi-Fi, or Bluetooth). The second antenna 440 may be used as an antenna of magnetic induction type (e.g., wireless charging, near field communication (NFC), or magnetic stripe transmission (MST)).

According to various embodiments, the dielectric constant and dielectric loss of a base layer forming the first antenna 420 may be lower than those of a base layer forming the second antenna 440. In order to secure the performance and bandwidth of the antenna in a thin thickness, the base layer of the first antenna 420 may be made of modified polyimide (MPI) or liquid crystal polymer (LCP), which is a material having a low dielectric constant and low dielectric loss. For example, the modified polyimide (MPI) may have a thickness of about 0.010 mm to about 0.050 mm. For example, the liquid crystal polymer (LCP) may have a thickness of about 0.025 mm to 0.1 mm. The base layer of the second antenna 440 may be made of, for example, polyimide. For example, this polyimide may have a thickness of about 0.0075 mm to 0.120 mm.

With reference to FIGS. 4 and 5, the second area 403 of the electronic device 400 according to various embodiments of the disclosure may include a battery 430, at least one FPCB 432, the heat dissipation member 418, a shielding sheet 435, and the second antenna 440.

According to an embodiment, the battery 430 may supply power to at least one component (e.g., the printed circuit board 410) of the electronic device 400.

According to various embodiments, the battery 430 may include the battery 350 illustrated in FIG. 3. The battery 430 may be disposed to be spaced apart from the printed circuit board 410 and the shield can 412 provided in the first area 401 by a predetermined distance. At least a portion of the battery 430 may be disposed substantially on the same plane as the printed circuit board 410.

According to an embodiment, the at least one FPCB 432 may be disposed on the battery 430. The at least one FPCB 432 may include at least one of a first FPCB 432a, a second FPCB 432b, or a third FPCB 432c.

According to various embodiments, the at least one FPCB 432 may further include other FPCB than the first FPCB 432a to the third FPCB 432c. The first FPCB 432a may include a display FPCB. The second FPCB 432b may include a sub FPCB. The third FPCB 432c may include an RF FPCB.

According to various embodiments, the first FPCB 432a (e.g., the display FPCB) may transmit a signal for controlling the display (e.g., the display 330 in FIG. 3). The second FPCB 432b (e.g., the sub FPCB) may transmit a signal for controlling main power of the electronic device 400 and charging of the battery 430. The third FPCB 432c (e.g., the RF FPCB) may transmit a signal for controlling wireless communication with an external electronic device.

According to an embodiment, the heat dissipation member 418 may be disposed on the at least one FPCB 432. The heat dissipation member 418 may be one extending integrally from the heat dissipation member 418 provided in the first area 401. The heat dissipation member 418 may disperse and discharge heat transferred from the heat dissipation member 418 provided in the first area 401 through the third area 405. The heat dissipation member 418 may be formed of at least one layer.

According to an embodiment, the shielding sheet 435 may be disposed on the heat dissipation member 418. The shielding sheet 435 may be attached to an upper surface of the heat dissipation member 418 through an adhesive sheet or bonding. The shielding sheet 435 may shield at least a portion of the second antenna 440 disposed thereon.

According to various embodiments, the shielding sheet 435 may include a magnetic material. The shielding sheet 435 may prevent and/or reduce an eddy current from being generated by the battery 430 or the heat dissipation member 418.

According to an embodiment, the second antenna 440 may be disposed on the shielding sheet 435. The second antenna 440 may be attached to an upper surface of the shielding sheet 435 through an adhesive sheet or bonding. The second antenna 440 may be formed of a flexible printed circuit board (FPCB). The second antenna 440 may include, for example, at least one of a magnetic secure transmission (MST) antenna, a near field communication (NFC) antenna, or a wireless charging antenna.

According to various embodiments, the shielding sheet 435 may be disposed only on the heat dissipation member 418 in the second area 403 and may not be disposed on the heat dissipation member 418 in the first area 401.

According to various embodiments, at least a portion of the second antenna 440 may extend integrally under the first antenna 420 provided in the first area 401. At least a portion of the second antenna 440 may be connected to the first antenna 420 through a connector. The first antenna 420 and the second antenna 440 may be attached through an adhesive tape.

With reference to FIG. 5, the third area 405 of the electronic device 400 according to various embodiments of the disclosure may include a speaker 450.

According to an embodiment, the speaker 450 may output a sound signal to the outside of the electronic device 400. The speaker 450 may include, for example, a sound output device or a receiver.

According to an embodiment, the heat dissipation member 418 and the second antenna 440 provided in the second area 403 may extend above the speaker 450.

According to various embodiments, the speaker 450 may include the sound output device 107 or the receiver 114 illustrated in FIGS. 1 and 2. The speaker 450 may be disposed to be spaced apart from the battery 430, the at least one FPCB 432, the heat dissipation member 418, and/or the shielding sheet 435 by a predetermined distance.

According to various embodiments, the electronic device 400 illustrated in FIGS. 4 and 5 may include the front plate 320, the display 330, the side member 310 (e.g., the housing), and the rear plate 380 illustrated in FIG. 3.

Figure 6A:
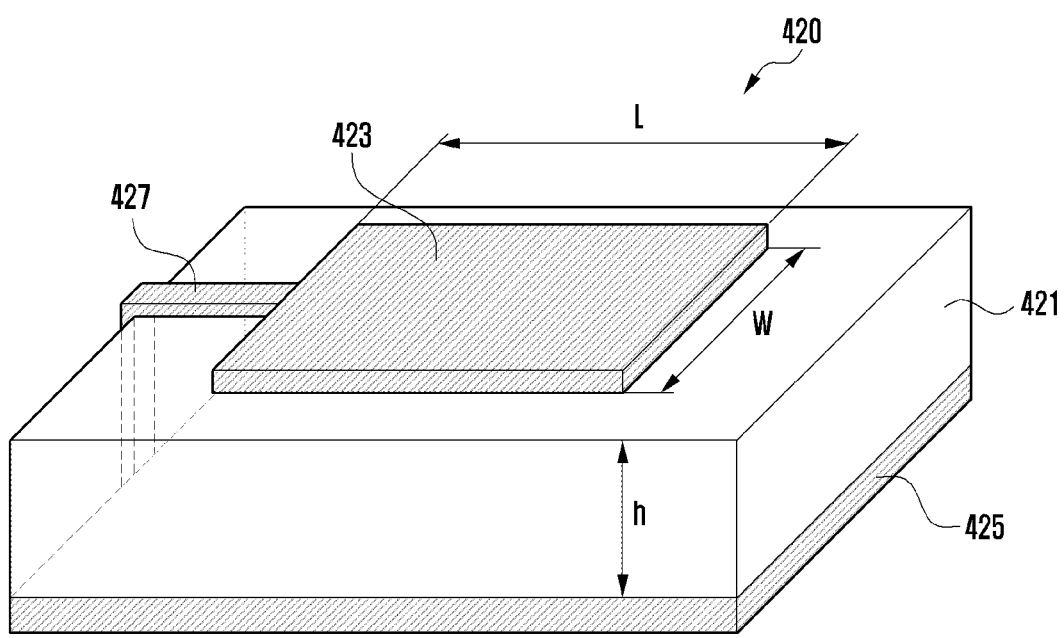
FIG. 6A is a perspective view illustrating an example configuration of a first antenna of an electronic device according to various embodiments.

FIG. 6A is a perspective view illustrating an example configuration of a first antenna of an electronic device according to various embodiments.

With reference to FIG. 6A, the first antenna 420 of the electronic device 420 according to various embodiments of the disclosure may include a dielectric 421, a first layer 423, and a second layer 425.

According to an embodiment, the dielectric 421 may be a base member. The dielectric 421 may include a substrate. The dielectric 421 may include a flexible printed circuit board (FPCB). The dielectric 421 may be made of a material (e.g., modified polyimide (MPI) or liquid crystal polymer (LCP)) having a low dielectric constant and a low dielectric loss.

According to an embodiment, the dielectric constant and dielectric loss of the base layer (e.g., dielectric) of the first antenna 420 may be lower than those of the base layer of the second antenna 440.

According to various embodiments, the bandwidth of the dielectric 421 may be excellent as the height (h) is high, the thickness is thick, or the dielectric constant is low. The efficiency of the first antenna 420 may be inversely proportional to the dielectric loss of the dielectric 421.

According to an embodiment, the first layer 423 may be disposed on a first surface (e.g., an upper surface) of the dielectric 421. The first layer 423 may include at least one patch layer disposed to form a directional beam. The first layer 423 may include at least one patch antenna array. For example, the width (W) and the length (L) of the first layer 423 are not limited and may vary depending on the performance of the first antenna 420.

According to an embodiment, the second layer 425 may be disposed on a second surface (e.g., a lower surface) of the dielectric 421. The second layer 425 may include a ground layer.

According to various embodiments, the first layer 423 and the second layer 425 may be connected using a connection member 427.

According to various embodiments, as the height (h) of the dielectric 421 is relatively great, the performance of the first antenna 420 may be improved. As the first layer 423 has a relatively wide width (W) and a relatively long length (L), the performance of the first antenna 420 may be improved.

Figure 6B:
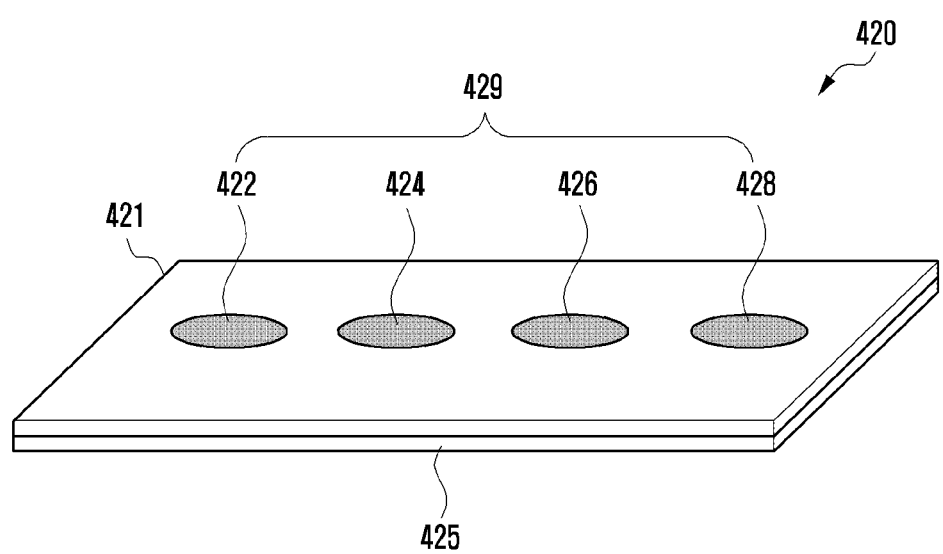
FIG. 6B is a perspective view illustrating an example configuration of a first antenna of an electronic device according to various embodiments.

FIG. 6B is a perspective view illustrating an example configuration of a first antenna of an electronic device according to various embodiments.

With reference to FIG. 6B, the first antenna 420 may include a dielectric 421 (e.g., the dielectric 421 in FIG. 6A), an antenna array 429 (e.g., the first layer 423 in FIG. 6A), and a ground layer 425 (e.g., the second layer 425 in FIG. 6A).

According to various embodiments, the dielectric 421 may include a plurality of conductive layers and a plurality of non-conductive layers alternately stacked with the conductive layers. Using wirings and conductive vias formed in the conductive layers, the dielectric 421 may provide an electrical connection between various electronic components disposed in the dielectric 421 and/or the outside.

According to various embodiments, the antenna array 429 may include a plurality of antenna elements 422, 424, 426, or 428 (e.g., conductive patches) disposed to form a directional beam. The antenna elements 422, 424, 426, or 428 may be formed on a first surface (e.g., an upper surface) of the dielectric 421. According to an embodiment, the antenna array 429 may be formed inside the dielectric 421. The antenna array 429 may include a plurality of antenna arrays having the same shape or different shapes and/or different types (e.g., a dipole antenna array and/or a patch antenna array).

According to various embodiments, the first antenna 420 may be electrically connected to another printed circuit board (e.g., the printed circuit board 340 in FIG. 3 and/or the printed circuit board 410 in FIG. 5) through a module interface. The module interface may include a connection member, for example, a coaxial cable connector, a board to board connector, an interposer, or a flexible printed circuit board (FPCB).

According to various embodiments, the ground layer 425 may be disposed on a second surface (e.g., a lower surface) of the dielectric 421 to perform a grounding function of the antenna array 429.

Figure 7:
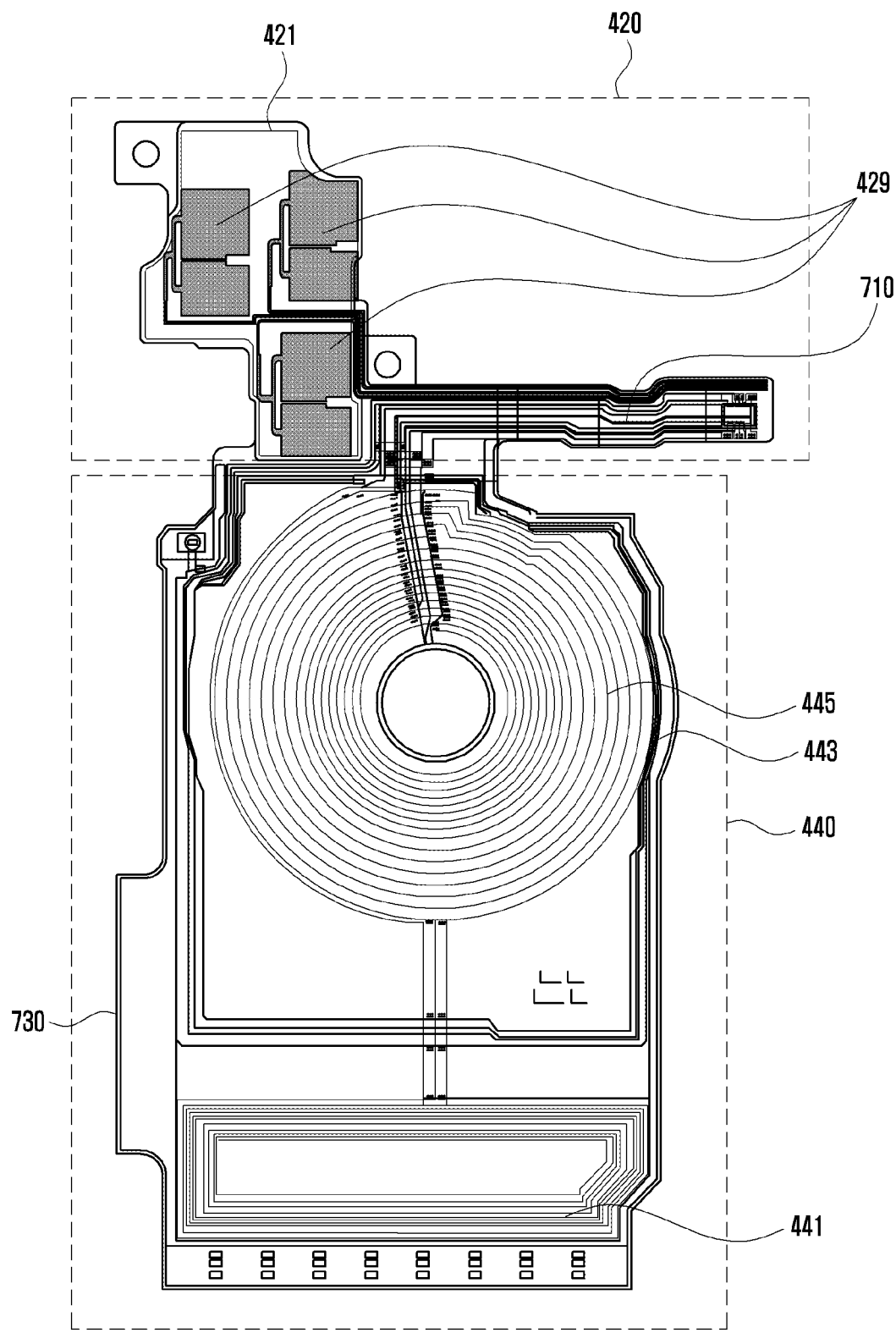
FIG. 7 is a diagram illustrating an example configuration of first and second antennas of an electronic device according to various embodiments.

FIG. 7 is a diagram illustrating an example configuration of first and second antennas of an electronic device according to various embodiments.

According to various embodiments, the embodiments described above in FIGS. 4, 5, 6A and 6B may be incorporated into the description of FIG. 7.

With reference to FIG. 7, the electronic device 400 according to various embodiments of the disclosure may include the first antenna 420 and the second antenna 440.

The first antenna 420 and the second antenna 440 may be electrically connected through the connector 710. The first antenna 420 and the second antenna 440 may be electrically connected to another printed circuit board (e.g., the printed circuit board 340 in FIG. 3 and/or the printed circuit board 410 in FIG. 5) using the connector 710.

According to various embodiments, the first antenna 420 may include the antenna array 429 (e.g., the conductive patch) formed on the first surface (e.g., the upper surface) of the dielectric 421. The antenna array 429 may include at least one antenna element 422, 424, 426, or 428 (e.g., the conductive patch) illustrated in FIG. 6B.

According to various embodiments, the second antenna 440 may include at least one of a magnetic secure transmission (MST) antenna 441, a near field communication (NFC) antenna 443, or a wireless charging antenna 445, which are formed on a first surface (e.g., an upper surface) of a dielectric substrate 730 (e.g., a base layer).

According to an embodiment, the MST antenna 441 may be formed on at least a portion (e.g., a lower portion) of the dielectric substrate 730. The MST antenna 441 may be used for a payment function of the electronic device 400. The MST antenna 441 may use, for example, a coil wound about 1 to 10 times. The inductance value of the MST antenna 441 may be, for example, about 1 to 20 uH.

According to an embodiment, the NFC antenna 443 may be formed on at least a portion (e.g., a middle portion and/or an upper portion) of the dielectric substrate 730. The NFC antenna 443 may be used for short-range communication of the electronic device 400. The inductance value of the NFC antenna 443 may be, for example, less than about 2 uH. The NFC antenna 443 may surround the wireless charging antenna 445.

According to an embodiment, the wireless charging antenna 445 may be formed inside the NFC antenna 443. The wireless charging antenna 445 may be used to charge the electronic device 400. The inductance value of the wireless charging antenna 445 may be, for example, about 5 to 10 uH. The wireless charging antenna 445 may include at least one layer.

According to various embodiments, the second antenna 440 may include at least one conductive layer (e.g., a copper (Cu) layer).

Figure 8:
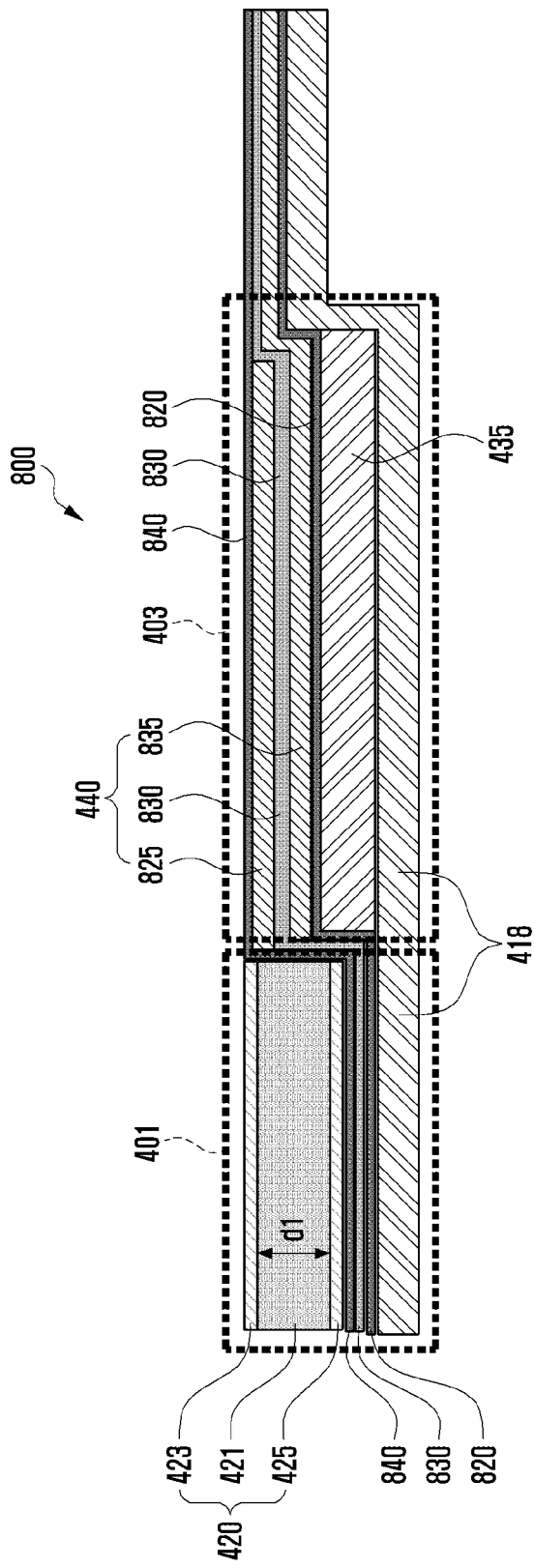
FIG. 8 is a cross-sectional view illustrating an example arrangement of first and second antennas of an electronic device according to various embodiments.

FIG. 8 is a cross-sectional view illustrating an example configuration of first and second antennas of an electronic device according to various embodiments.

According to various embodiments, the embodiments described above in FIGS. 4, 5, 6A, 6B and 7 (which may be referred to as FIGS. 4 to 7) may be incorporated into the description of FIG. 8.

In the description of FIG. 8, the same reference numerals are assigned to the same components as those of the above-described embodiments illustrated in FIGS. 4 to 7, and repeated descriptions may not be provided.

According to various embodiments, the electronic device 800 of FIG. 8 may include the electronic devices 100, 300, and 400 illustrated in FIGS. 1 to 5. The embodiment regarding the electronic device 800 of FIG. 8 may be applied to the above-described embodiments illustrated in FIGS. 4 and 5.

With reference to FIG. 8, the first area 401 of the electronic device 800 according to various embodiments of the disclosure may include the heat dissipation member 418, a first protective film 820, a base layer 830, a second protective film 840, and the first antenna 420.

According to an embodiment, the heat dissipation member 418 may be disposed on the support member 416 illustrated in FIG. 5.

According to an embodiment, the first protective film 820 may be adhered to the upper surface of the heat dissipation member 418. The first protective film 820 may protect the heat dissipation member 418. The first protective film 820 may extend above the shielding sheet 435 in the second area 403.

According to an embodiment, the base layer 830 may be disposed on the first protective film 820. The base layer 830 may be attached to an upper surface of the first protective film 820 through an adhesive sheet or bonding. The base layer 830 may form the base layer 830 of the second antenna 440 provided in the second area 403. The base layer 830 may include the dielectric substrate 730 illustrated in FIG. 7. The first protective film 820 and the second protective film 840 may include a coverlay film.

According to an embodiment, the second protective film 840 may be disposed on the base layer 830 (e.g., the dielectric substrate 730). The second protective film 840 may protect the base layer 830. The second protective film 840 may extend above the second antenna 440 provided in the second area 403.

According to an embodiment, the first antenna 420 may include the dielectric 421, the first layer 423 (e.g., a patch layer), and the second layer 425 (e.g., a ground layer), which are shown in FIG. 6A. According to an embodiment, the first antenna 420 may include the dielectric 421, the antenna array 429, and the ground layer 425 (e.g., the second layer 425), which are shown in FIGS. 6B and 7.

According to various embodiments, the dielectric properties of the base layer 830 and the dielectric 421 may be different.

According to various embodiments, at least one of the first protective film 820, the base layer 830, and the second protective film 840 provided in the first area 401 may be selectively omitted.

With reference to FIG. 8, the second area 403 of the electronic device 800 according to various embodiments of the disclosure may include the heat dissipation member 418, the shielding sheet 435, the first protective film 820, the second antenna 440, and the second protective film 840.

According to an embodiment, the heat dissipation member 418 may be disposed on the at least one FPCB 432 illustrated in FIG. 5. The heat dissipation member 418 may be one extending integrally from the heat dissipation member 418 provided in the first area 401.

According to an embodiment, the shielding sheet 435 may be disposed on the heat dissipation member 418. The shielding sheet 435 may shield at least a portion of the second antenna 440 disposed thereon.

According to an embodiment, the first protective film 820 may be disposed on the shielding sheet 435. The first protective film 820 may protect the shielding sheet 435. The first protective film 820 may be one extending integrally with a step difference from the first protective film 820 provided in the first area 401.

According to an embodiment, the second antenna 440 may be disposed on the first protective film 820 or the shielding sheet 435. In the case that the second antenna 440 is disposed on the shielding sheet 435, the first protective film 820 may be omitted.

According to various embodiments, the second antenna 440 may include a first conductive layer 825, a base layer 830, and a second conductive layer 835.

According to various embodiments, the second conductive layer 835 (e.g., the wireless charging antenna 445 and/or the NFC antenna 443 in FIG. 7) may be disposed under the base layer 830. The second conductive layer 835 may be disposed on the first protective film 820. The second conductive layer 835 may include a copper (Cu) layer.

According to various embodiments, the base layer 830 (e.g., the dielectric substrate 730 in FIG. 7) may include a dielectric layer. The base layer 830 may be one extending integrally with a step difference from the base layer 830 provided in the first area 401.

According to various embodiments, the first conductive layer 825 (e.g., the wireless charging antenna 445 and/or the NFC antenna 443 in FIG. 7) may be disposed on the base layer 830. The second conductive layer 835 may include a copper (Cu) layer.

According to various embodiments, the first conductive layer 825 and the second conductive layer 835 may have the same thickness.

According to an embodiment, the second protective film 840 may be disposed on the second antenna 440. The second protective film 840 may be disposed on the first conductive layer 825 of the second antenna 440. The second protective film 840 may be one extending integrally with a step difference from the second protective film 840 provided in the first area 401.

Figure 9:
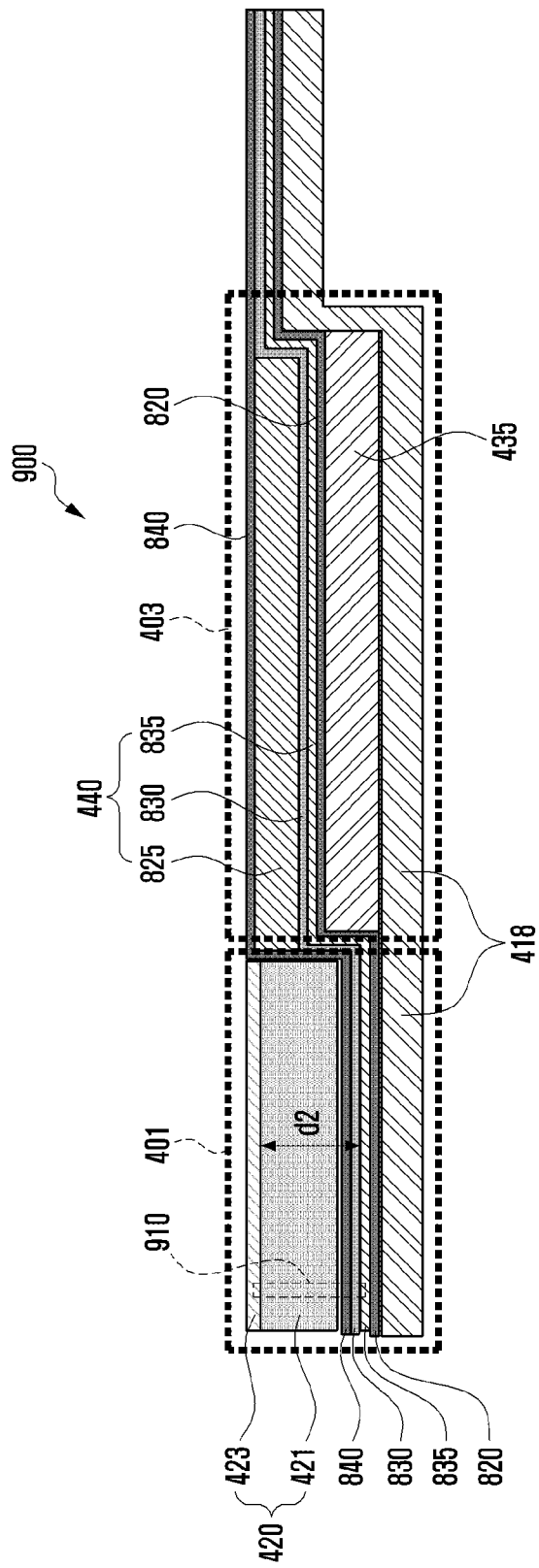
FIG. 9 is a cross-sectional view illustrating an example configuration of first and second antennas of an electronic device according to various embodiments.

FIG. 9 is a cross-sectional view illustrating an example configuration of first and second antennas of an electronic device according to various embodiments.

According to various embodiments, the embodiments described above in FIGS. 4 to 8 may be incorporated into the description of FIG. 9. In the description of FIG. 9, the same reference numerals are assigned to the same components as those of the above-described embodiments illustrated in FIGS. 4 to 8, and repeated descriptions may not be provided.

According to various embodiments, the electronic device 900 of FIG. 9 may include the electronic devices 100, 300, 400, and 800 illustrated in FIGS. 1 to 5, and 8. The embodiment regarding the electronic device 900 of FIG. 9 may be applied to the above-described embodiments illustrated in FIGS. 4, 5, and 8.

According to various embodiments, in the electronic device 900 of FIG. 9, the second layer 425 (e.g., the ground layer) of the first antenna 420 is omitted, and the second conductive layer 835 of the second antenna 440 may perform a function of the second layer 425 (e.g., the ground layer) of the first antenna 420.

With reference to FIG. 9, the first area 401 of the electronic device 900 according to various embodiments of the disclosure may include the heat dissipation member 418, the first protective film 820, the second conductive layer 835 of the second antenna 440 provided in the second area 403, the base layer 830, the second protective film 840, and the first antenna 420.

According to an embodiment, the heat dissipation member 418 may be disposed on the support member 416 illustrated in FIG. 5.

According to an embodiment, the first protective film 820 may be adhered to the upper surface of the heat dissipation member 418. The first protective film 820 may protect the heat dissipation member 418. The first protective film 820 may extend above the shielding sheet 435 in the second area 403.

According to an embodiment, the second conductive layer 835 (e.g., the wireless charging antenna 445 and/or the NFC antenna 443 in FIG. 7) may be disposed on the first protective film 820. The second conductive layer 835 may be one extending from the second conductive layer 835 of the second antenna 440 provided in the second area 403. The second conductive layer 835 may perform a function (e.g., grounding) of the second layer 425 (e.g., a grounding layer) of the first antenna 420.

According to an embodiment, the base layer 830 (e.g., the dielectric substrate 730 in FIG. 7) may be disposed on the second conductive layer 835.

According to an embodiment, the second protective film 840 may be disposed on the base layer 830. The second protective film 840 may protect the base layer 830. The second protective film 840 may extend above the second antenna 440 provided in the second area 403.

According to an embodiment, the first antenna 420 may include the dielectric 421 and the first layer 423 (e.g., the patch layer), which are shown in FIG. 6 or FIG. 8. In the first antenna 420, the second layer 425 (e.g., the ground layer) may be removed, and the above-described second conductive layer 835 of the second antenna 440 may perform a grounding function. The first layer 423 of the first antenna 420 may be connected to the second conductive layer 835 of the second antenna 440 through a via 910.

According to various embodiments, the first conductive layer 825 of the second antenna 440 may be thicker than the second conductive layer 835.

According to various embodiments, in the case that the second layer 425 (e.g., the ground layer) of the first antenna 420 is implemented as the second conductive layer 835 of the second antenna 440, a distance (d2) between the first layer 423 of the first antenna 420 and the second conductive layer 835 of the second antenna 440, as shown in FIG. 9, may be extended than a distance (d1) between the first layer 423 and the second layer 425 of the first antenna 420 as shown in FIG. 8.

According to various embodiments, at least one of the first protective film 820 and the base layer 830 provided in the first area 401 may be omitted.

With reference to FIG. 9, the second area 403 of the electronic device 900 according to various embodiments of the disclosure may include the heat dissipation member 418, the shielding sheet 435, the first protective film 820, the second antenna 440, and the second protective film 840.

According to an embodiment, the heat dissipation member 418 may be disposed on the at least one FPCB 432 illustrated in FIG. 5. The heat dissipation member 418 may be one extending integrally from the heat dissipation member 418 provided in the first area 401.

According to an embodiment, the shielding sheet 435 may be disposed on the heat dissipation member 418. The shielding sheet 435 may shield at least a portion of the second antenna 440 disposed thereon.

According to an embodiment, the first protective film 820 may be disposed on the shielding sheet 435. The first protective film 820 may be one extending integrally with a step difference from the first protective film 820 provided in the first area 401.

According to an embodiment, the second antenna 440 may be disposed on the first protective film 820 or the shielding sheet 435. In the case that the second antenna 440 is disposed on the shielding sheet 435, the first protective film 820 may be omitted.

According to various embodiments, the second antenna 440 may include the first conductive layer 825, the base layer 830, and the second conductive layer 835.

According to various embodiments, the second conductive layer 835 may be disposed under the base layer 830. The second conductive layer 835 may be disposed on the first protective film 820.

According to various embodiments, the second conductive layer 835 may be one extending with a step difference from the second conductive layer 835 provided in the first area 401.

According to various embodiments, the base layer 830 may be disposed on the second conductive layer 835. The base layer 830 may be one extending integrally with a step difference from the base layer 830 provided in the first area 401.

According to various embodiments, the first conductive layer 825 may be disposed on the base layer 830.

According to various embodiments, the first conductive layer 825 and the second conductive layer 835 may be different in thickness. The first conductive layer 825 may be thicker than the second conductive layer 835.

According to an embodiment, the second protective film 840 may be disposed on the second antenna 440. The second protective film 840 may be disposed on the first conductive layer 825 of the second antenna 440. The second protective film 840 may be integrally formed with a step difference from the second protective film 840 provided in the first area 401.

Figure 10:
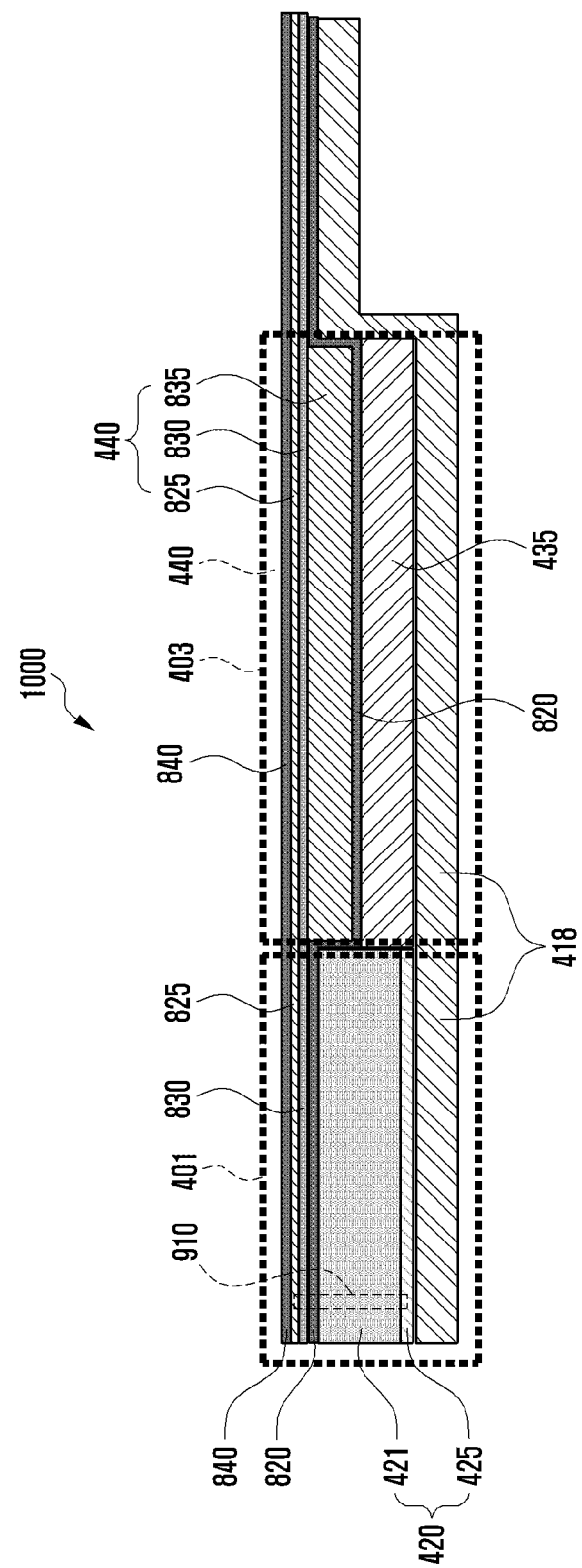
FIG. 10 is a cross-sectional view illustrating an example arrangement of first and second antennas of an electronic device according to various embodiments.

FIG. 10 is a cross-sectional view illustrating an example configuration of first and second antennas of an electronic device according to various embodiments.

According to various embodiments, the embodiments described above in FIGS. 4 to 9 may be incorporated into the description of FIG. 10.

In the description of FIG. 10, the same reference numerals are assigned to the same components as those of the above-described embodiments illustrated in FIGS. 4 to 9, and repeated descriptions may not be provided.

According to various embodiments, the electronic device 1000 of FIG. 10 may include the electronic devices 100, 300, 400, 800, and 900 illustrated in FIGS. 1 to 5, 8, and 9. The embodiment regarding the electronic device 1000 of FIG. 10 may be applied to the above-described embodiments illustrated in FIGS. 4, 5, 8, and 9.

According to various embodiments, in the electronic device 1000 of FIG. 10, the first layer 423 (e.g., the patch layer) of the first antenna 420 is omitted, and the first conductive layer 825 of the second antenna 440 may perform a function of the first layer 423 (e.g., the patch layer) of the first antenna 420.

With reference to FIG. 10, the first area 401 of the electronic device 1000 according to various embodiments of the disclosure may include the heat dissipation member 418, the first antenna 420, the first protective film 820, the base layer 830, the first conductive layer 825 of the second antenna 440 provided in the second area 403, and the second protective film 840.

According to an embodiment, the heat dissipation member 418 may be disposed on the support member 416 illustrated in FIG. 5.

According to an embodiment, the first antenna 420 may be disposed on the heat dissipation member 418. The first antenna 420 may include the dielectric 421 and the second layer 425 (e.g., the ground layer), which are shown in FIGS. 6, 8, and 9. In the first antenna 420, the first layer 423 (e.g., the patch layer) may be removed, and the above-described first conductive layer 825 of the second antenna 440 may perform a function of a patch antenna. The first conductive layer 825 of the second antenna 440 may be connected to the second layer 425 of the first antenna 420 through the via 910.

According to various embodiments, the first conductive layer 825 of the second antenna 440 may be thinner than the second conductive layer 835.

According to various embodiments, in the case that the first layer 423 (e.g., the patch layer) of the first antenna 420 is implemented as the first conductive layer 825 of the second antenna 440, a distance between the second layer 425 of the first antenna 420 and the first conductive layer 825 of the second antenna 440 may be extended than a distance between the first layer 423 and the second layer 425 of the first antenna 420 shown in FIG. 8.

According to an embodiment, the first protective film 820 may be adhered to the upper surface of the first antenna 420. The first protective film 820 may protect the first antenna 420. The first protective film 820 may extend above the shielding sheet 435 in the second area 403.

According to an embodiment, the base layer 830 may be disposed on the first protective film 820.

According to an embodiment, the first conductive layer 825 may be disposed on the base layer 830. The first conductive layer 825 may be one extending from the first conductive layer 825 of the second antenna 440 provided in the second area 403. The first conductive layer 825 may perform a function (e.g., a radiator) of the first layer 423 (e.g., the patch layer) of the first antenna 420.

According to an embodiment, the second protective film 840 may be disposed on the first conductive layer 825. The second protective film 840 may protect the first conductive layer 825. The second protective film 840 may extend to the second area 403.

According to various embodiments, the first protective film 820 provided in the first area 401 may be omitted.

With reference to FIG. 10, the second area 403 of the electronic device 1000 according to various embodiments of the disclosure may include the heat dissipation member 418, the shielding sheet 435, the first protective film 820, the second antenna 440, and the second protective film 840.

According to an embodiment, the heat dissipation member 418 may be disposed on the at least one FPCB 432 illustrated in FIG. 5. The heat dissipation member 418 may be one extending integrally from the heat dissipation member 418 provided in the first area 401.

According to an embodiment, the shielding sheet 435 may be disposed on the heat dissipation member 418. The shielding sheet 435 may shield at least a portion of the second antenna 440 disposed thereon.

According to an embodiment, the first protective film 820 may be disposed on the shielding sheet 435. The first protective film 820 may be one extending integrally with a step difference from the first protective film 820 provided in the first area 401.

According to an embodiment, the second antenna 440 may be disposed on the first protective film 820 or the shielding sheet 435. In the case that the second antenna 440 is disposed on the shielding sheet 435, the first protective film 820 may be omitted.

According to various embodiments, the second antenna 440 may include the first conductive layer 825, the base layer 830, and the second conductive layer 835.

According to various embodiments, the second conductive layer 835 may be disposed under the base layer 830.

According to various embodiments, the second conductive layer 835 may be disposed on the first protective film 820.

According to various embodiments, the base layer 830 may be disposed on the second conductive layer 835. The base layer 830 may be one extending integrally from the base layer 830 provided in the first area 401. The base layer 830 may be formed on the same plane without a step difference.

According to various embodiments, the first conductive layer 825 may be disposed on the base layer 830. The first conductive layer 825 may be one extending from the first conductive layer 825 provided in the first area 401. The first conductive layer 825 may be formed on the same plane without a step difference.

According to various embodiments, the first conductive layer 825 and the second conductive layer 835 may be different in thickness. The first conductive layer 825 may be thinner than the second conductive layer 835.

According to an embodiment, the second protective film 840 may be disposed on the second antenna 440. The second protective film 840 may be disposed on the first conductive layer 825 of the second antenna 440. The second protective film 840 may be one extending integrally from the second protective film 840 provided in the first area 401.

Figure 11:
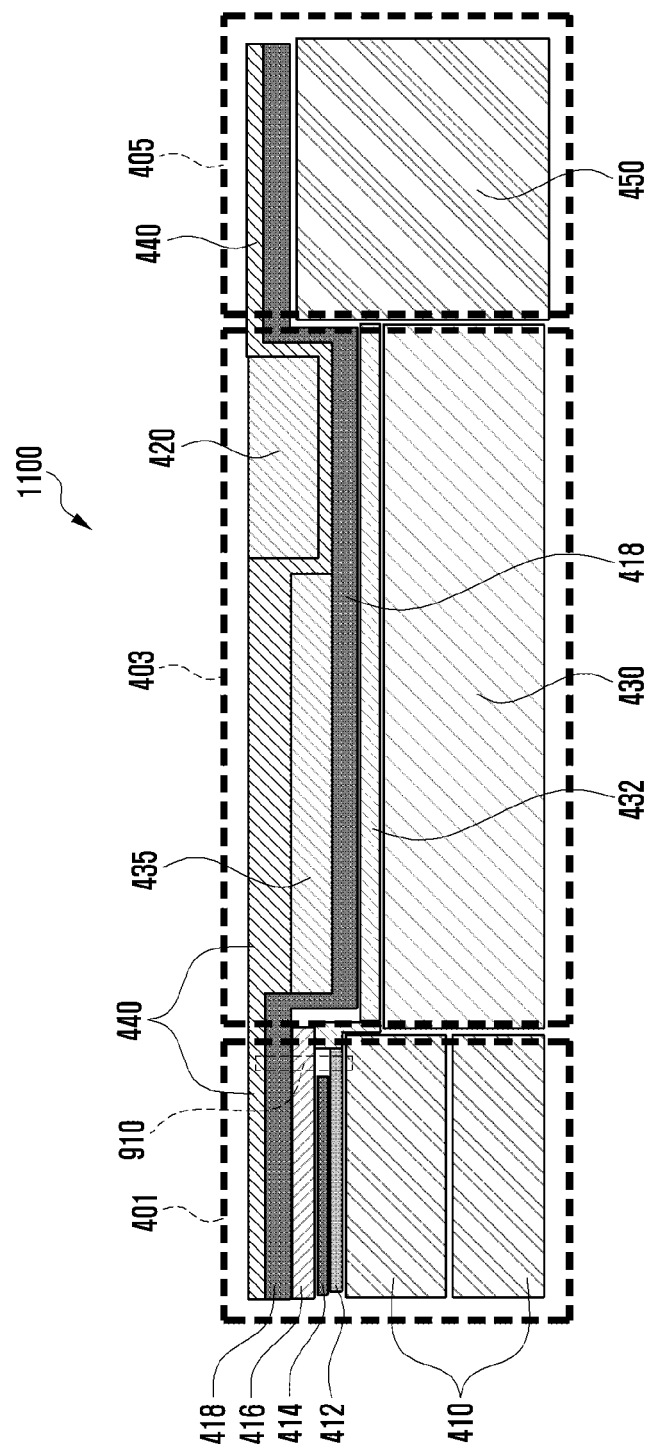
FIG. 11 is a cross-sectional view illustrating an example arrangement of first and second antennas of an electronic device according to various embodiments.

FIG. 11 is a cross-sectional view illustrating various example configurations of first and second antennas of an electronic device according to various embodiments.

According to various embodiments, the embodiments described above in FIGS. 4 to 10 may be incorporated into the description of FIG. 11.

In the description of FIG. 11, the same reference numerals are assigned to the same components as those of the above-described embodiments illustrated in FIGS. 4 to 10, and repeated descriptions may not be provided.

According to various embodiments, the electronic device 1100 of FIG. 11 may include the electronic devices 100, 300, 400, 800, 900, and 1000 illustrated in FIGS. 1 to 5 and 8 to 10. The embodiment regarding the electronic device 1100 of FIG. 11 may be applied to the above-described embodiments illustrated in FIGS. 4, 5, and 8 to 10.

According to various embodiments, in the electronic device 1100 of FIG. 11, the first antenna 420 and the second antenna 440 may be disposed on the battery 430 provided in the second area 403. The first antenna 420 may be mounted in a space from which a pattern of the second antenna 440 is partially removed.

According to various embodiments, the second antenna 440 may include, for example, at least one of the magnetic secure transmission (MST) antenna 441, the near field communication (NFC) antenna 443, or the wireless charging antenna 445. The space from which the pattern of the second antenna 440 is partially removed may include a space where at least a portion of the MST antenna 441, the NFC antenna 443, or the wireless charging antenna 445 is removed or bypassed.

With reference to FIG. 11, the first area 401 of the electronic device 1100 according to various embodiments of the disclosure may include the printed circuit board 410, the shield can 412, the heat dissipation sheet 414, the support member 416, the heat dissipation member 418, and the second antenna 440.

According to an embodiment, at least a portion of the printed circuit board 410 may ground the second antenna 440 using the via 910.

According to an embodiment, the shield can 412 may be disposed on the printed circuit board 410.

According to an embodiment, the heat dissipation sheet 414 may be disposed on the shield can 412.

According to an embodiment, the support member 416 may be disposed on the heat dissipation sheet 414. The support member 416 may support at least a portion of the heat dissipation member 418 and the second antenna 440 disposed thereon.

According to an embodiment, the heat dissipation member 418 may be disposed on the support member 416. The heat dissipation member 418 may extend to the second area 403 and the third area 405.

According to an embodiment, at least a portion of the second antenna 440 provided in the second area 403 may be disposed above the heat dissipation member 418 provided in the first area 401.

With reference to FIG. 11, the second area 403 of the electronic device 1100 according to various embodiments of the disclosure may include the battery 430, the at least one FPCB 432, the heat dissipation member 418, the shielding seat 435, the second antenna 440, and the first antenna 420.

According to an embodiment, the battery 430 may supply power to at least one component (e.g., the printed circuit board 410) of the electronic device 400. The battery 430 may be disposed to be spaced apart from the printed circuit board 410 and the shield can 412 provided in the first area 401 by a predetermined distance.

According to an embodiment, the at least one FPCB 432 may be disposed on the battery 430. The at least one FPCB 432 may include at least one of the first FPCB 432a, the second FPCB 432b, or the third FPCB 432c illustrated in FIGS. 4 and 5.

According to various embodiments, the first FPCB 432a (e.g., the display FPCB) may transmit a signal for controlling the display (e.g., the display 330 in FIG. 3). The second FPCB 432b (e.g., the sub FPCB) may transmit a signal for controlling main power of the electronic device 400 and charging of the battery 430. The third FPCB 432c (e.g., the RF FPCB) may transmit a signal for controlling wireless communication with an external electronic device.

According to an embodiment, the heat dissipation member 418 may be disposed on the at least one FPCB 432. The heat dissipation member 418 may be one extending integrally from the heat dissipation member 418 provided in the first area 401.

According to an embodiment, the shielding sheet 435 may be disposed on the heat dissipation member 418.

According to an embodiment, the second antenna 440 may be disposed on the shielding sheet 435.

According to an embodiment, the first antenna 420 may be mounted in a space from which the pattern of the second antenna 440 is partially removed. The shielding sheet 435 may not be disposed under the first antenna 440.

According to various embodiments, the first antenna 420 and the second antenna 440 may be disposed above the battery 430 provided in the second area 403.

With reference to FIG. 11, the third area 405 of the electronic device 1100 according to various embodiments of the disclosure may include the speaker 450.

According to an embodiment, the speaker 450 may output a sound signal to the outside of the electronic device 400.

According to an embodiment, the heat dissipation member 418 and the second antenna 440 provided in the second area 403 may extend above the speaker 450.

According to various embodiments, the electronic device 1100 illustrated in FIG. 11 may include the front plate 320, the display 330, the side member 310 (e.g., the housing), and the rear plate 380, which are illustrated in FIG. 3.

Figure 12:
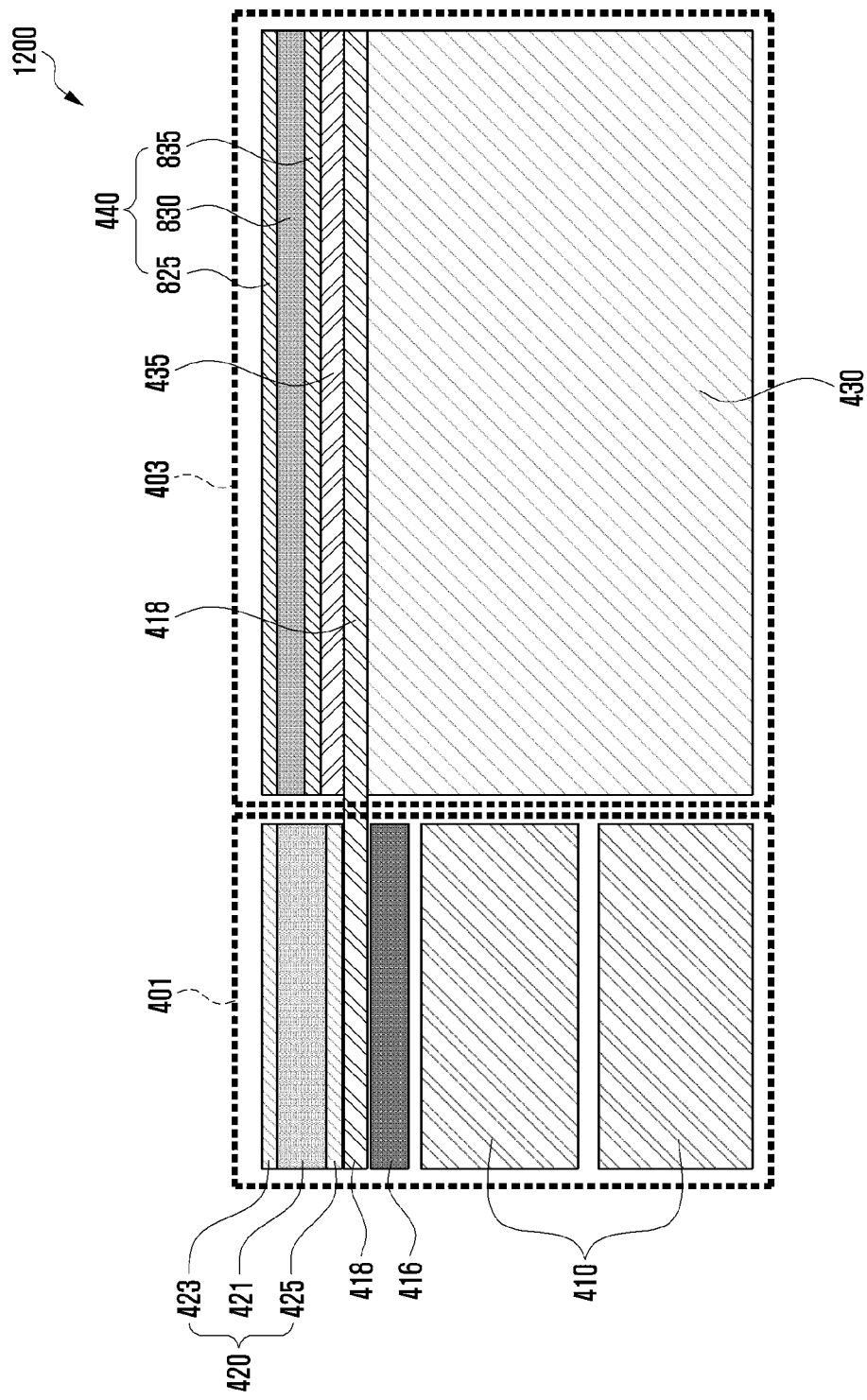
FIG. 12 is a cross-sectional view illustrating an example arrangement of first and second antennas of an electronic device according to various embodiments.

FIG. 12 is a cross-sectional view illustrating various configurations of first and second antennas of an electronic device according to various embodiments.

According to various embodiments, the embodiments described above in FIGS. 4 to 11 may be incorporated into the description of FIG. 12.

In the description of FIG. 12, the same reference numerals are assigned to the same components as those of the above-described embodiments illustrated in FIGS. 4 to 11, and repeated descriptions may not be provided.

According to various embodiments, the electronic device 1200 of FIG. 12 may include the electronic devices 100, 300, 400, 800, 900, 1000, and 1100 illustrated in FIGS. 1 to 11. The embodiment regarding the electronic device 1200 of FIG. 12 may be applied to the above-described embodiments illustrated in FIGS. 4 and 5.

With reference to FIG. 12, the electronic device 1200 according to various embodiments of the disclosure may include the first area 401 and the second area 403.

According to various embodiments, the first area 401 may include the printed circuit board 410, the support member 416, the heat dissipation member 418, and the first antenna 420.

According to an embodiment, the printed circuit board 410 may include a structure in which a plurality of printed circuit boards (PCB s) are stacked. In the case that the printed circuit boards 410 are stacked using a plurality of printed circuit boards, the stacked printed circuit boards may be connected through an interposer.

According to an embodiment, the support member 416 may be disposed on the printed circuit board 410 at a predetermined interval. The support member 416 may support the heat dissipation member 418 and the first antenna 420 disposed thereon.

According to various embodiments, between the printed circuit board 410 and the support member 416, the shield can 412 and the heat dissipation sheet 414 shown in FIG. 5 may be included.

According to an embodiment, the heat dissipation member 418 may be disposed on the support member 416. The heat dissipation member 418 disposed in the first area 401 may extend to the second area 403. The heat dissipation member 418 disposed in the first area 401 and the second area 403 may be formed on the same plane.

According to an embodiment, the first antenna 420 may be disposed on the heat dissipation member 418.

According to various embodiments, the first antenna 420 may include the dielectric 421, the first layer 423 (e.g., the patch layer), and the second layer 425 (e.g., the ground layer).

According to various embodiments, the second area 403 may include the battery 430, the heat dissipation member 418, the shielding sheet 435, and the second antenna 440.

According to an embodiment, the battery 430 may supply power to at least one component (e.g., the printed circuit board 410) of the electronic device 1200.

According to various embodiments, the battery 430 may be disposed to be spaced apart from the printed circuit board 410 and the support member 416 provided in the first area 401 by a predetermined distance.

According to an embodiment, the heat dissipation member 418 may be disposed on the battery 430. The heat dissipation member 418 may be one extending integrally from the heat dissipation member 418 disposed in the first area 401.

According to an embodiment, the shielding sheet 435 may be disposed on the heat dissipation member 418. The shielding sheet 435 may be disposed only on the heat dissipation member 418 of the second area 403, and may not be disposed on the heat dissipation member 418 of the first area 401.

According to an embodiment, the second antenna 440 may be disposed on the shielding sheet 435. The second antenna 440 may include, for example, at least one of the magnetic secure transmission (MST) antenna 441, the near field communication (NFC) antenna 443, and the wireless charging antenna 445.

According to various embodiments, the second antenna 440 may include the first conductive layer 825, the base layer 830, and the second conductive layer 835.

According to various embodiments, the second conductive layer 835 (e.g., the wireless charging antenna 445 and/or the NFC antenna 443 in FIG. 7) may be disposed under the base layer 830. The second conductive layer 835 may be disposed on the shielding sheet 435.

According to various embodiments, the base layer 830 (e.g., the dielectric substrate 730 in FIG. 7) may include a dielectric layer.

According to various embodiments, the first conductive layer 825 (e.g., the wireless charging antenna 445 and/or the NFC antenna 443 in FIG. 7) may be disposed on the base layer 830.

According to various embodiments, the first conductive layer 825 and the second conductive layer 835 may have the same thickness. The first conductive layer 825 and the second conductive layer 835 may be different in thickness.

According to various embodiments, the first antenna 420 disposed in the first area 401 and the second antenna 440 disposed in the second area 403 may be disposed to be spaced apart from each other by a predetermined distance.

Figure 13A:
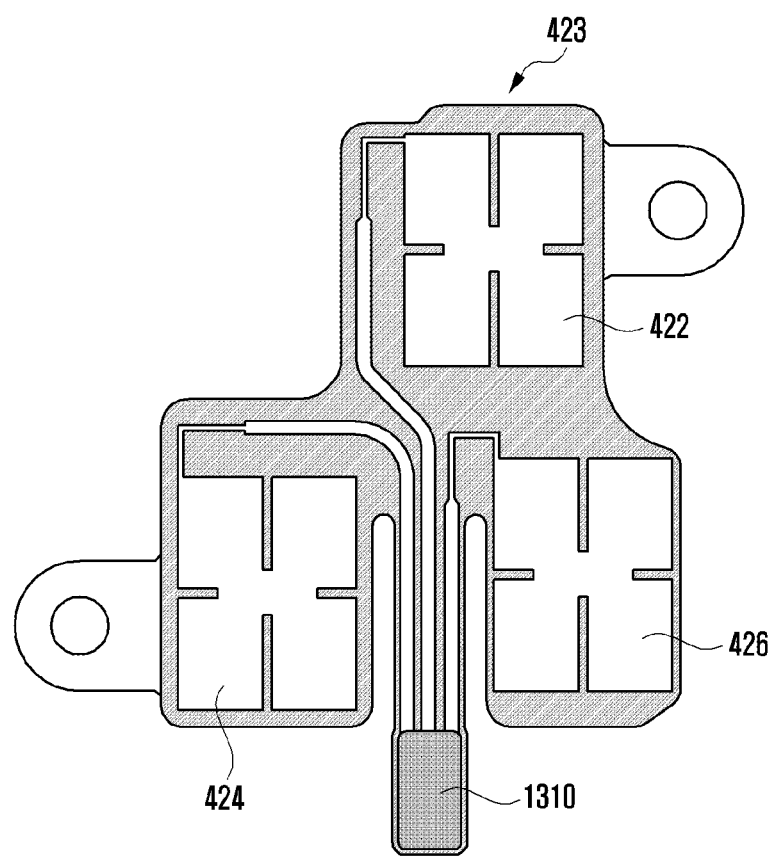
FIGS. 13A and 13B are diagrams illustrating a first layer and a second layer of a first antenna of an electronic device according to various embodiments.
Figure 13B:
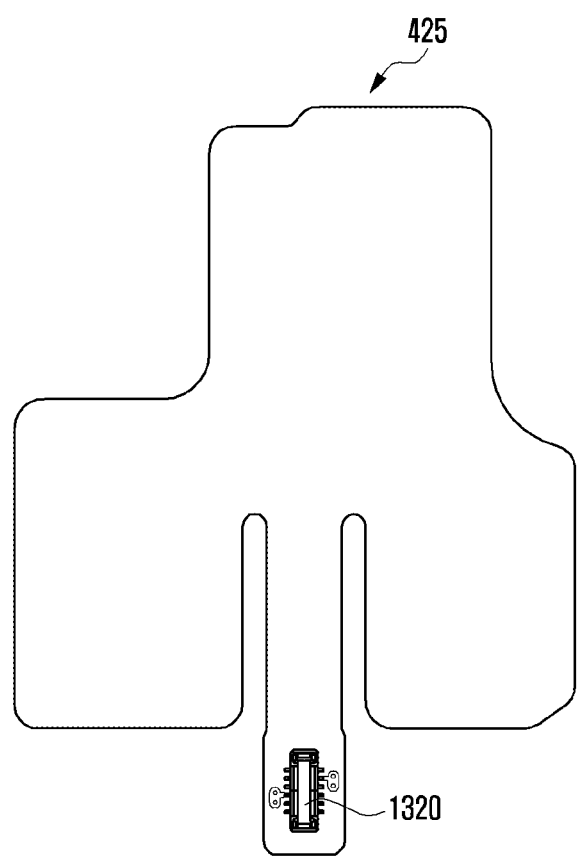

FIGS. 13A and 13B are diagrams illustrating a first layer and a second layer of a first antenna of an electronic device according to various embodiments.

With reference to FIG. 13A, the first layer 423 (e.g., the patch layer) of the first antenna 420 according to various embodiments of the disclosure may include a plurality of antenna elements (e.g., 422, 424, and 426) illustrated in FIG. 6B.

According to an embodiment, the plurality of antenna elements (e.g., 422, 424, and 426) may be disposed at a predetermined interval. The plurality of antenna elements (e.g., 422, 424, and 426) may be disposed at the same Z-axis interval as the ground. The plurality of antenna elements (e.g., 422, 424, and 426) may be connected to a first contact 1310 through a pattern (e.g., copper).

According to various embodiments, the plurality of antenna elements (e.g., 422, 424, and 426) may be disposed at a Z-axis interval to implement a similar beam pattern.

According to various embodiments, the antenna elements (e.g., 422, 424, and 426) may be formed on a first surface (e.g., an upper surface) of, or inside, the dielectric 421. The antenna elements (e.g., 422, 424, and 426) may include a plurality of antenna arrays having the same shape or different shapes and/or different types (e.g., a dipole antenna array and/or a patch antenna array).

With reference to FIG. 13B, the second layer 425 (e.g., the ground layer) of the first antenna 420 according to various embodiments of the disclosure may include a second contact 1320.

According to an embodiment, the second layer 425 (e.g., the ground layer) may be connected to the first contact 1310 of the first layer 423 through the second contact 1320 and thereby perform a grounding function.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a printed circuit board disposed in a first area of the electronic device;
    a battery disposed in a second area of the electronic device;
    a heat dissipation member comprising a thermally conductive material;
    a first antenna disposed in the first area on the heat dissipation member and including a dielectric and a patch layer disposed on the dielectric; and
    a second antenna disposed in the second area on the heat dissipation member and including a base layer, a first conductive layer disposed on the base layer, and a second conductive layer disposed under the base layer,
    wherein the base layer and the second conductive layer are extended under the dielectric of the first antenna,
    wherein the patch layer of the first antenna is connected to the second conductive layer extended under the dielectric through a via, and
    wherein a frequency band of the first antenna and a frequency band of the second antenna are different.

2. The electronic device of claim 1, wherein the first antenna includes a radio frequency (RF) resonance type antenna, and the second antenna includes a magnetic induction type antenna.

3. The electronic device of claim 1, wherein the first antenna includes at least one patch antenna, and the second antenna includes at least one coil antenna.

4. The electronic device of claim 1, wherein the first antenna has a dielectric constant and dielectric loss less than a dielectric constant and a dielectric loss of the second antenna.

5. The electronic device of claim 1, wherein the first area includes:
    a shield can disposed on the printed circuit board;
    a heat dissipation sheet disposed on the shield can; and
    a support disposed on the heat dissipation sheet,
    wherein the heat dissipation member is disposed on the support.

6. The electronic device of claim 1, wherein the first antenna and the second antenna are spaced apart from each other by a specified distance.

7. The electronic device of claim 1, further comprising:
    a shielding sheet disposed on the heat dissipation member in the second area; and
    at least one protective film integrally disposed on the heat dissipation member in the first area and the shielding sheet in the second area.

8. The electronic device of claim 7, wherein the second antenna is disposed on the shielding sheet, and
    wherein the first conductive layer and the second conductive layer have a same thickness or have different thicknesses.

9. An electronic device comprising:
a printed circuit board disposed in a first area of the electronic device;
a battery disposed in a second area of the electronic device;
a heat dissipation member comprising a thermally conductive material disposed on the printed circuit board and the battery, the heat dissipation member at least partially extending between the first area and the second area;
a first antenna disposed in the first area on the heat dissipation member and including a dielectric and a first layer disposed on the dielectric; and
a second antenna disposed in the second area on the heat dissipation member and including a base layer, a first conductive layer disposed on the base layer, and a second conductive layer disposed under the base layer,
wherein the first antenna is disposed on at least a portion of the base layer of the second antenna, and
wherein the second conductive layer extends under the dielectric of the first antenna and is configured to provide a grounding function of the first antenna.

10. The electronic device of claim 9, wherein the first antenna includes a radio frequency (RF) resonance type antenna, and the second antenna includes a magnetic induction type antenna.

11. The electronic device of claim 9, wherein the dielectric of the first antenna has a dielectric constant and dielectric loss less than a dielectric constant and dielectric loss of the base layer of the second antenna.

12. An electronic device comprising:
a printed circuit board disposed in a first area of the electronic device;
a battery disposed in a second area of the electronic device;
a heat dissipation member comprising a thermally conductive material disposed on the printed circuit board and the battery;
a first antenna disposed in the first area on the heat dissipation member and including a dielectric and a second layer disposed under the dielectric; and
a second antenna disposed in the second area on the heat dissipation member and including a base layer, a first conductive layer disposed on the base layer, and a second conductive layer disposed under the base layer,
wherein the base layer and the first conductive layer of the second antenna extend over the dielectric of the first antenna in the first area, and the first conductive layer is configured to perform a patch function of the first antenna.

13. The electronic device of claim 12, wherein the dielectric of the first antenna has a dielectric constant and dielectric loss less than a dielectric constant and dielectric loss of the base layer of the second antenna.

\* \* \* \* \*